(12) United States Patent
Aliakseyeu et al.

(10) Patent No.: US 11,080,437 B2
(45) Date of Patent: Aug. 3, 2021

(54) CUSTOM LIGHTING

(71) Applicant: SIGNIFY HOLDING B.V., Eindhoven (NL)

(72) Inventors: Dzmitry Viktorovich Aliakseyeu, Eindhoven (NL); Bartel Marinus Van De Sluis, Eindhoven (NL); Jochen Renaat Van Gheluwe, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 349 days.

(21) Appl. No.: 16/329,285

(22) PCT Filed: Aug. 29, 2017

(86) PCT No.: PCT/EP2017/071640
§ 371 (c)(1),
(2) Date: Feb. 28, 2019

(87) PCT Pub. No.: WO2018/041821
PCT Pub. Date: Mar. 8, 2018

(65) Prior Publication Data
US 2019/0228111 A1    Jul. 25, 2019

(30) Foreign Application Priority Data

Sep. 1, 2016  (EP) ................................. 16186733

(51) Int. Cl.
*H05B 47/105*   (2020.01)
*G06T 15/50*    (2011.01)
(Continued)

(52) U.S. Cl.
CPC ............. *G06F 30/00* (2020.01); *G06T 15/50* (2013.01); *G06T 19/00* (2013.01); *G06T 19/20* (2013.01);
(Continued)

(58) Field of Classification Search
CPC .. H05B 47/105; H05B 47/125; H05B 47/175; H05B 47/19; G06T 15/50; G06T 7/70;
(Continued)

(56) References Cited

U.S. PATENT DOCUMENTS 7,178,941 B2 *   2/2007   Roberge ................ G06F 3/1446
                                                                362/225
8,928,662 B2     1/2015   Gordin et al.
(Continued)

FOREIGN PATENT DOCUMENTS

WO    200218913 A2    3/2002
WO    2013186684 A2   12/2013

OTHER PUBLICATIONS

Masatoshi Akita, et al., "Optimizaiton of the Height of Height-Adjustable Luminaire for Intelligent Lighting System", Artificial Intelligence and Soft Computing, Springer Berlin Heidelberg, Berlin, Heidelberg, Germany, Jun. 13, 2010, pp. 355-362.

(Continued)

*Primary Examiner* — Haissa Philogene

(57) ABSTRACT

A method of specifying a lighting effect to be emitted by an illumination source in order to illuminate a target object. The method comprises: placing a camera at a position at which the illumination source is installed or to be installed, or elsewhere on a straight line between that position and the target object; directing the camera along this line toward the target object; with the camera so placed and directed, using the camera to capture at least one image of the target object; automatically determining one or more parameters of the target object based on the at least one captured image; automatically specifying one or more properties for the lighting effect in dependence on the one or more parameters of the target object as determined based on the at least one (Continued)

captured image; and instigating creation of the lighting effect to include the one or more specified properties.

13 Claims, 11 Drawing Sheets

(51) Int. Cl.
| | | |
|---|---|---|
| *G06F 30/00* | (2020.01) | |
| *G06T 19/00* | (2011.01) | |
| *H05B 47/19* | (2020.01) | |
| *G06T 19/20* | (2011.01) | |

(52) U.S. Cl.
CPC .......... *H05B 47/105* (2020.01); *H05B 47/19* (2020.01); *G06T 2200/24* (2013.01)

(58) Field of Classification Search
CPC . G06T 2200/24; G06T 2201/00; G06T 19/00; G06T 19/20; H04N 13/221; H04N 13/271; H04N 5/2256; Y02B 20/40; G06F 30/00; G06F 3/011
See application file for complete search history.

(56) References Cited

U.S. PATENT DOCUMENTS

| | | | |
|---|---|---|---|
| 9,001,226 B1* | 4/2015 | Ng | H04N 5/23203 |
| | | | 348/211.11 |
| 9,148,573 B2* | 9/2015 | Short | G03B 17/54 |
| 9,377,413 B2* | 6/2016 | Hermary | G01B 11/2545 |
| 9,414,780 B2* | 8/2016 | Rhoads | G06F 16/245 |
| 9,869,863 B2* | 1/2018 | Souchard | H04N 13/221 |
| 10,616,540 B2* | 4/2020 | Engelen | G06F 3/0488 |
| 10,816,939 B1* | 10/2020 | Coleman | G01S 7/00 |
| 10,885,377 B2* | 1/2021 | Harrison | G06F 30/20 |
| 2011/0163683 A1 | 7/2011 | Steele et al. | |
| 2012/0095745 A1 | 4/2012 | Le Guevel-Scholtens et al. | |
| 2014/0267866 A1 | 9/2014 | Short et al. | |

OTHER PUBLICATIONS

Makoto Okabe, et al., "Illumination Brush: Interactive Design of All-Frequency Lighting", Computer Graphics and Applications, 15th Pacific Conference on Computer Graphics and Applications, IEEE Computer Society, 2007, pp. 171-180.

Hai Nam Ha, et al., "Lighting by Example with Wavelets", Culture Lab School of Computing Science, Newcastle University, Newcastle Upon Tyne, United Kingdom, 2007, pp. 110-123.

Anonymous: "Made to order", Mar. 31, 2015 (Mar. 31, 2015), XP002775253, Retrieved from the Internet <URL:http://www.gelighting.com/LightingWeb/na/images/VERT036-GE-Industrial-Lighting-Systems-Brochure_tcm201-93762.pdf>.

* cited by examiner

CUSTOM LIGHTING

CROSS-REFERENCE TO PRIOR APPLICATIONS

This application is the U.S. National Phase application under 35 U.S.C. § 371 of International Application No. PCT/EP2017/071640, filed on Aug. 29, 2017, which claims the benefit of European Patent Application No. 16186733.8, filed on Sep. 1, 2016. These applications are hereby incorporated by reference herein.

TECHNICAL FIELD

The present disclosure relates to the design of a custom lighting effect with which to illuminate a target object.

BACKGROUND

As modern lighting such as LED-based lighting has become more and more versatile in recent years, it has become possible to create a unique personalized lighting device that is unique not only in the way it looks but also in its light output. For instance custom luminaries can be created using 3D printing techniques, or custom optical elements can be created using 3D printing or other techniques. One of the simplest examples of how the light output of a lighting device can be customized is a gobo, i.e. an optical element that is placed in front of a light source to control the shape and/or pattern of the emitted lighting effect (effectively a stencil for light). Gobos can provide a range of different lighting effects, from the abstract to very complex image-like effects.

FIGS. 1 and 2 illustrate some examples of a custom designed luminaire 10. FIG. 3 shows an example of a custom lighting pattern 32 that may be created when a beam of light 30 is shone through a custom gobo.

However, even with simple elements like gobos it can be challenging for non-professional home users to design or select such an element, or to precisely define what light properties he or she would like to have. It can be even more challenging for a user to design a custom luminaire. Such challenges can be especially acute when the purpose is not to create a general decorative effect but rather to illuminate a specific object in user's home or the like.

WO 2013/186684 discloses a tool for assisting a user in the design of a custom lighting device. The tool uses 3D scanning software to scan an environment to be illuminated, and thereby generate a virtual model of the environment. The modelled environment includes a custom designed light fixture and a certain object such as a dining table which the user wishes to illuminate with the custom designed lighting fixture. Using the tool, the user can then manually manipulate properties of the custom lighting fixture such as its beam size or beam footprint, and the model shows the user how adjusting these properties affects the appearance of the lighting effect when cast upon the object of interest. Once the user is happy with the design, he or she can then place an order for the designed light fixture, or print it using a 3D printer.

SUMMARY

The tool described in WO 2013/186684 provides a user-friendly experience but still requires the user to manually design the custom light fixture. It would be desirable to provide a technique for automatically specifying one or more properties of a custom lighting device or fixture in dependence on a certain target object to be illuminated, e.g. to automatically adapt the shape and size of the beam to the shape and size of the object, such as an artwork to be illuminated, or the like. However, an image processing algorithm may not be able to reliably or accurately detect the relevant parameters of the target object from simply any arbitrary image of the environment.

According to one aspect disclosed herein there is provided a method of specifying a lighting effect to be emitted by an illumination source in order to illuminate a target object. The method comprises: placing a camera of a camera device (e.g. a smartphone or tablet) at a position at which the illumination source is installed or to be installed, or elsewhere on a straight line between said position and the target object; and directing the camera along said line toward the target object. Then, with the camera so placed and directed, the camera is used to capture at least one image of the target object. The method then further comprises: automatically determining one or more parameters of the target object based on the at least one captured image, automatically specifying one or more properties for said lighting effect in dependence on the one or more parameters of the target object as determined based on the at least one captured image, and instigating creation of said lighting effect so as to include the one or more specified properties.

For instance, the one or more specified properties of the lighting effect may comprise one or more of: a shape of the lighting effect, a size of one or more dimensions of the lighting effect, a pattern of the lighting effect, one or more colours of the lighting effect, and/or a location of a feature of the lighting effect. The one or more parameters of the target object determined from the at least one captured image may comprise one or more of: a shape of the target object, a size of one or more dimensions of the target object, a distance of the target object from said position, an orientation of the target object, and/or one or more colours of the target object.

By capturing an image from the "viewpoint" of the illumination source, or the as-yet to-be-installed illumination source, then advantageously it is possible to automatically generate the custom lighting design based on a reliable estimate of the relevant property or properties of the target object, as would be experienced from the perspective of the illumination source. Without a picture taken from the point of view of the illumination source, then the user would instead need to somehow manually indicate on the image(s) the position of the light source, and somehow map the target object, the camera position and orientation and the light source position and orientation in 3D space; or else the image recognition algorithm would have to attempt to do this from an oblique angle, but that would be more prone to error because of this unconducive angle from which the image or images were captured. Further, without taken from the point of view of the illumination source, then multiple images would instead be needed from different directions to build up a 3D model. Whereas in embodiments of the present invention, the image need only be a single still 2D image such as may be obtained by a conventional smartphone or tablet camera, or the like. Hence in embodiments the system does not necessarily require a complex 3D scan of the environment as in WO 2013/186684.

There are a number of options for instigating the creation of the custom lighting effect. For instance, said specifying may comprise generating a specification for the illumination source or at least one custom component of the illumination source, and said instigating may comprise outputting the specification to a system or service for generating the custom component. E.g. said outputting may comprise sending the specification to a 3D printer with a request to print the at least one custom component. Or as another example, said outputting may comprise placing an order for the at least one custom component over the Internet. The at least one custom component may for example comprise a gobo. Or the illumination source may comprise a luminaire and the specification may be for a custom luminaire body for the luminaire, or even an entire custom luminaire.

In alternative embodiments, the instigating of the custom lighting effect may not involve the ordering or generation of a custom component or illumination source. Instead, the illumination source may have an electronically controllable illumination output. E.g. the illumination source may take the form of a luminaire comprising a group of multiple light-emitting elements such as multiple LEDs or multiple LEDs subgroups, which can be individually controlled in order to create different lighting patterns, colours and/or beam shapes. In such embodiments said instigating of the custom lighting effect may comprise controlling the illumination output to render said lighting effect with the specified property or properties.

In embodiments, the method may further comprise displaying the automatically determined lighting effect, and/or the automatically generated specification for the custom component, to the user as a preview in a graphical user interface prior to said instigating. The method may also comprise, via the graphical user interface, offering the user one or both of the options of: confirming whether to proceed with said instigating, and/or manually modifying the lighting effect and/or specification prior to said instigating. Thus although the custom design is specified automatically, advantageously the user is nonetheless provided with a preview and the chance to check whether the design is to his or her liking before going ahead (e.g. before ordering or printing the custom component or device). And in embodiments, the user can also manually tweak the design beforehand as well.

In embodiments, the method may further comprise use of a display on a secondary device separate to the camera device (in a separate housing and in embodiments not physically connected at all). The display on the secondary device may be used to display one or more of: said preview of the automatically determined lighting effect, said preview of the at least one custom component, and/or a preview of the one or more images prior to capture. This is advantageous in the case where the camera device is to be held at a position that is not so easily accessible for the user to view the preview on a screen of the camera device. For example, if the camera device takes the form of a smartphone or tablet, but when held at the position of the illumination source its screen is not easily visible to the user, then a secondary device in a form such as a smartwatch may be used to provide said user interface for displaying the preview.

In embodiments, the camera may be placed on said line but away from said position. This advantageously means that the user does not necessarily have to hold the camera right up against the position of the illumination source or to-be-installed illumination source, which may be at a location such as the ceiling which is not readily accessible for the user. Instead the camera may be held at a more convenient or comfortable location, such as half way between the ceiling and the target object.

If the camera is not at the same position as the illumination source, the distance between the camera and the illumination source will need to be taken into account in determining the one or more parameters of the target object. This distance could be input manually by a user. However, in embodiments a technique is provided for instead doing this automatically. That is, in embodiments the camera device (e.g. smartphone or tablet) may comprise both a front-facing camera and a rear-facing camera, and the above-mentioned camera may be one of the front- and rear-facing cameras. Further, in such cases, the method may further comprise using the other of the front- and rear-facing cameras to detect a distance between the camera device and said position, and the determination of the one or more parameters of the target object may be further based on the detected distance between the camera device and said position. Thus by using the distance detected by a camera on the opposing side of the device to that which captures the target object, then the parameters as would be experienced from the perspective of the true position of the illumination source (e.g. the ceiling) can be automatically computed in order to specify the custom design.

In embodiments, the illumination source comprises (or will comprise if yet to be created) multiple constituent lighting devices, e.g. multiple spotlights. In this case said steps of placing, directing, determining and specifying may be performed for each of the constituent lighting devices respectively, in order to create an overall lighting design combining the constituent effects of the multiple devices. Thus advantageously an overall lighting effect can be designed exploiting multiple illumination sources such as multiple spotlights in a given room, or such like.

According to another aspect disclosed herein, there is provided computing equipment (e.g. a smartphone or tablet running a suitable app) for specifying a lighting effect to be emitted by an illumination source in order to illuminate a target object. The computing equipment comprises: a camera or an input interface for receiving an input from the camera; an output interface for instigating creation of a lighting effect; and image processing module configured to process at least one image captured by the camera from a perspective of (A) the camera being placed at a position at which the illumination source is installed or to be installed, or elsewhere on a straight line between said position and the target object, and (B) the camera being directed along said line toward the target object. The image processing module may be configured to automatically determine one or more parameters of the target object based on the at least one image captured from said perspective, to automatically specify one or more properties for said lighting effect in dependence on the one or more parameters of the target object as determined based on said at least one captured image, and via said output interface to instigate the creation of said lighting effect so as to include the one or more specified properties.

In embodiments the computing equipment may be further configured in accordance with any of the above-mentioned method features. For instance the output interface may comprise an interface to a 3D printer for outputting the generated specification to the 3D printer to be printed, or the output interface may comprise an interface to the Internet for placing the order for the custom design, or in the case of an illumination source with an electronically controllable illumination output the output interface may comprise an output to control the emitted illumination to render the custom lighting effect. The computing equipment may also comprise a secondary device such as a smart watch for providing the preview. Further, in embodiments the image processing module may be configured to use both a front and rear facing camera to allow the camera device to be held away from the position of the illumination source, as discussed above.

According to another aspect disclosed herein, there may be provided a computer program product for specifying a lighting effect to be emitted by an illumination source in order to illuminate a target object, the computer program product comprising code embodied on computer-readable storage and configured so as when run on one or more processing units to perform operations of: receiving at least one image captured by a camera from a perspective of (A) the camera being placed at a position at which the illumination source is installed or to be installed, or elsewhere on a straight line between said position and the target object, and (B) the camera being directed along said line toward the target object; automatically determining one or more parameters of the target object based on the at least one image captured from said perspective; automatically specifying one or more properties for said lighting effect in dependence on the one or more parameters of the target object as determined based on said at least one captured image; and instigating creation of said lighting effect so as to include the one or more specified properties.

In embodiments the computer program product may be further configured to perform any of the non-manual method steps set out above, or may be configured to control any of the above-mentioned equipment features.

BRIEF DESCRIPTION OF THE DRAWINGS

To assist understanding of the present disclosure and to show how embodiments may be put into effect, reference is made by way of example to the accompanying drawings in which.

DETAILED DESCRIPTION OF EMBODIMENTS

Figure 1:
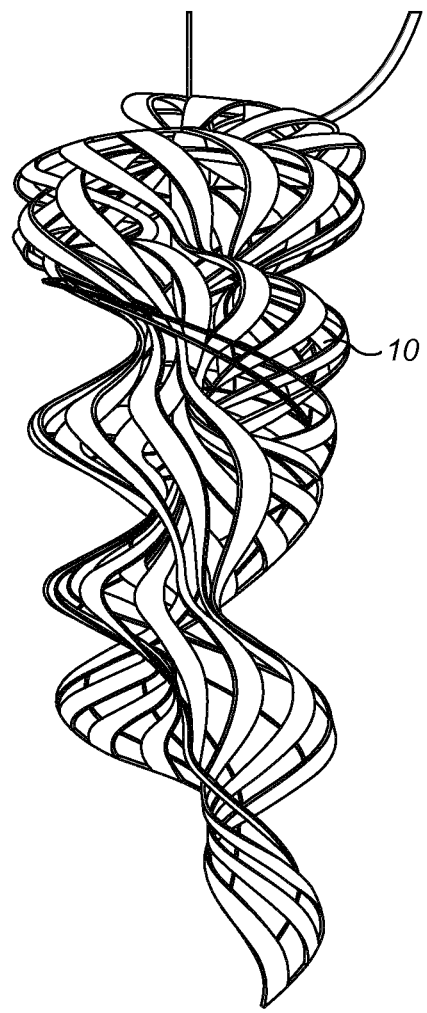
FIG. 1 is an illustration of a custom lighting device.
Figure 2:
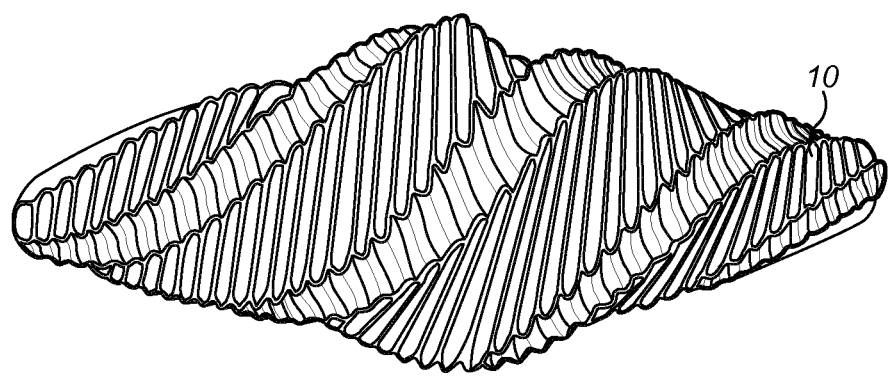
FIG. 2 is an illustration of another custom lighting device.

As mentioned above, as lighting based on LEDs and LED modules continues to become more versatile and flexible, it becomes possible to create a unique personalized lighting device that is unique not only in the way it looks but also in its light output. It will however be challenging for a home user to precisely define what light properties he or she would want to have. The following describes a method to address such a challenge for situations where the intended use of the lighting device is to illuminate a specific object, e.g. an art piece, picture on the wall, book shelf, etc.

According to embodiments disclosed herein, this is achieved by using a smart device 40 with a camera (e.g. a smartphone) to capture an image of the target object 44 from the intended position of a to-be-installed lighting device 10 for illuminating the object 44. For instance see FIG. 6, to be described in more detail shortly. The dimensions of the object 44 (e.g. its shape, size, and/or distance and distance from the lighting device 10) may then be derived from the image taken by the smart device 40. Then, based on the detected properties of the target object 44 and the intended location of the illumination source 10, a custom design for the lighting device 10 can be created, where customization might include beam shape, lighting pattern, beam size, and/or colour temperature, etc. After customizing the properties of the lighting device 10, the user may place an order for the customized lighting device, or print the design via a 3D printer.

In embodiments the smart device 40 may be arranged to generate an impression (a 'preview') 44' of how the object 44 will look under the light from the new lighting device 10. Additionally, the smart device 40 may comprise a user interface (UI) 42 which allows a user to tweak the properties of the design of lighting device 10.

Figure 4:
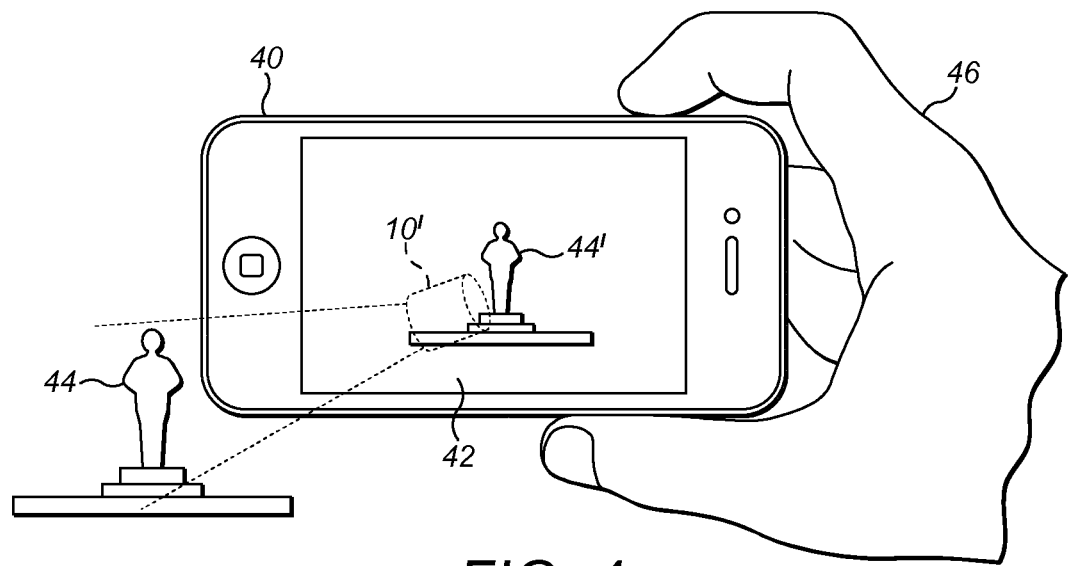
FIG. 4 is an illustration of a smart device, light source and target object.
Figure 5:
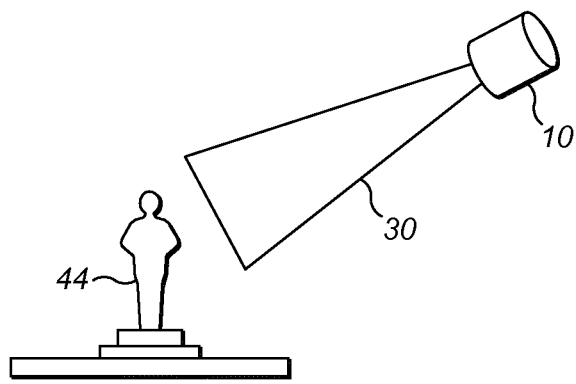
FIG. 5 is an illustration of a spotlight illuminating a target object.
Figure 6:
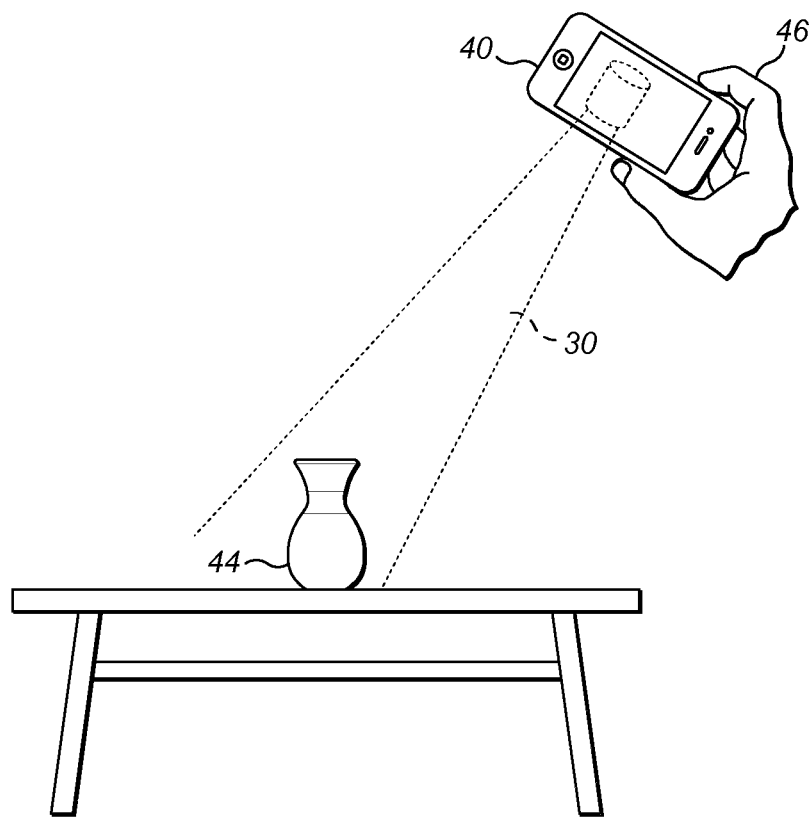
FIG. 6 is another schematic illustration of a smartphone, light source and target object.
Figure 16:
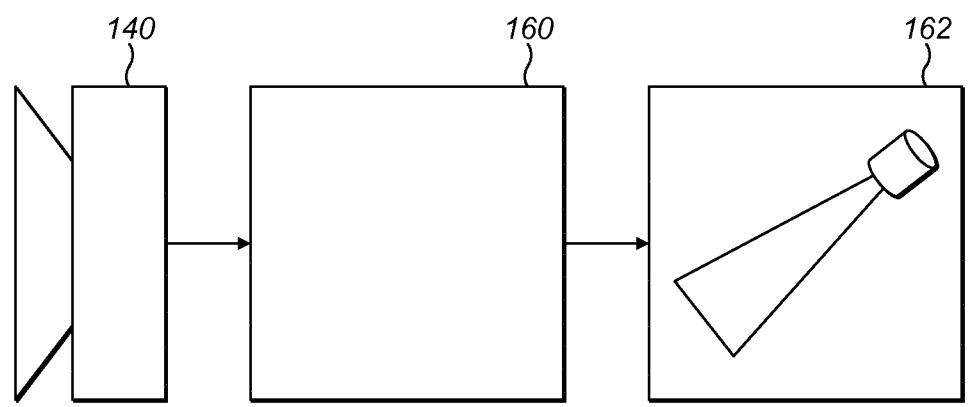
FIG. 16 is a block diagram of a system for automatically designing a custom lighting effect.

Reference is now made to FIG. 16 in conjunction with FIGS. 4 to 6. As shown in FIG. 16, according to embodiments disclosed herein there is a provided a system comprising a camera 140, a lighting design tool 160 and a lighting implementation means 162. The camera 140 is coupled to the lighting design tool 160 and thereby arranged to supply one or more images captured by the camera 140 to the lighting design tool 160.

In embodiments the camera 140 is incorporated into a smart device in the form of a smartphone or tablet 40, as shown in FIGS. 4 and 6. The camera 140 may be the front-facing camera of the smart device, i.e. the camera on the same face as the main screen 42 of the smart device 40. In embodiments the lighting design tool 160 is implemented in the form of software stored in a memory of the smart device 40 and arranged to run on a processing apparatus of the smart device 40 (the memory on which the software is stored comprising one or more memory units employing one or more memory media, e.g. an electronic memory such as an EEPROM or "flash" memory, or a magnetic memory such as a hard disk; and the processor on which the software is run comprising one or more processing units). For instance the software may take the form of a so-called "app" for aiding the user 46 in designing a custom lighting effect, for example by designing a custom lighting device or a custom component of such a lighting device (e.g. a gobo) configured to produce the desired effect.

In alternative embodiments, the camera 140 need not necessarily be the camera of a smart device 40 such as smartphone or tablet, and/or the lighting design tool 160 need not be implemented on such smart device 40 (or not wholly so).

For instance, in embodiments the lighting design tool 160 may be partially or wholly hosted on a server and merely accessed through the smart device 40 (e.g. through a web-browser running on the smart device 40, or through a dedicated client application running on the smart device 40). In this case the smart device 40 connects to the lighting design tool 160 on the server via any wired and/or wireless network(s), for example via a wide area network such as the Internet and/or a mobile cellular network, and/or via a wired local area network such as an Ethernet network or a wireless local area network based on a short-range RF technology such as Wi-Fi, ZigBee, Bluetooth or Thread, etc., or any combination of these and/or other means.

Furthermore, the camera 140 does not necessarily have to be incorporated into the smart device 40. Instead the camera may be external to the device 40 providing the user interface 42 and/or the device(s) on which the lighting design tool 160 is implemented. Moreover, the device 40 providing the user interface 42 does not necessarily have to take the form of a smartphone or tablet. For instance the device 40 may take the form of any other mobile device such as a laptop computer, or a static terminal such as a desktop computer, or even a wearable device such as a smart watch or a pair of smart glasses. In some embodiments, the user interface 42 may even be provided by a combination of devices such as a smart phone or tablet working in conjunction with a wearable device such as a smart watch or smart glasses (by connecting to one another via any wireless technology, e.g. a short range RF technology such as Wi-Fi, ZigBee, Bluetooth, Thread, etc.).

By way of illustration, embodiments in the following will be described in terms of a preferred embodiment of a camera 140 incorporated in a smart device 40 such as a smartphone or tablet, and a tool 160 in the form of an app running on the same smart device 40 (or partially or wholly hosted on a server and accessed from this smart device 40). However, it will be appreciated that this is not limiting and other arrangements such as those outlined above are possible.

Figure 3:
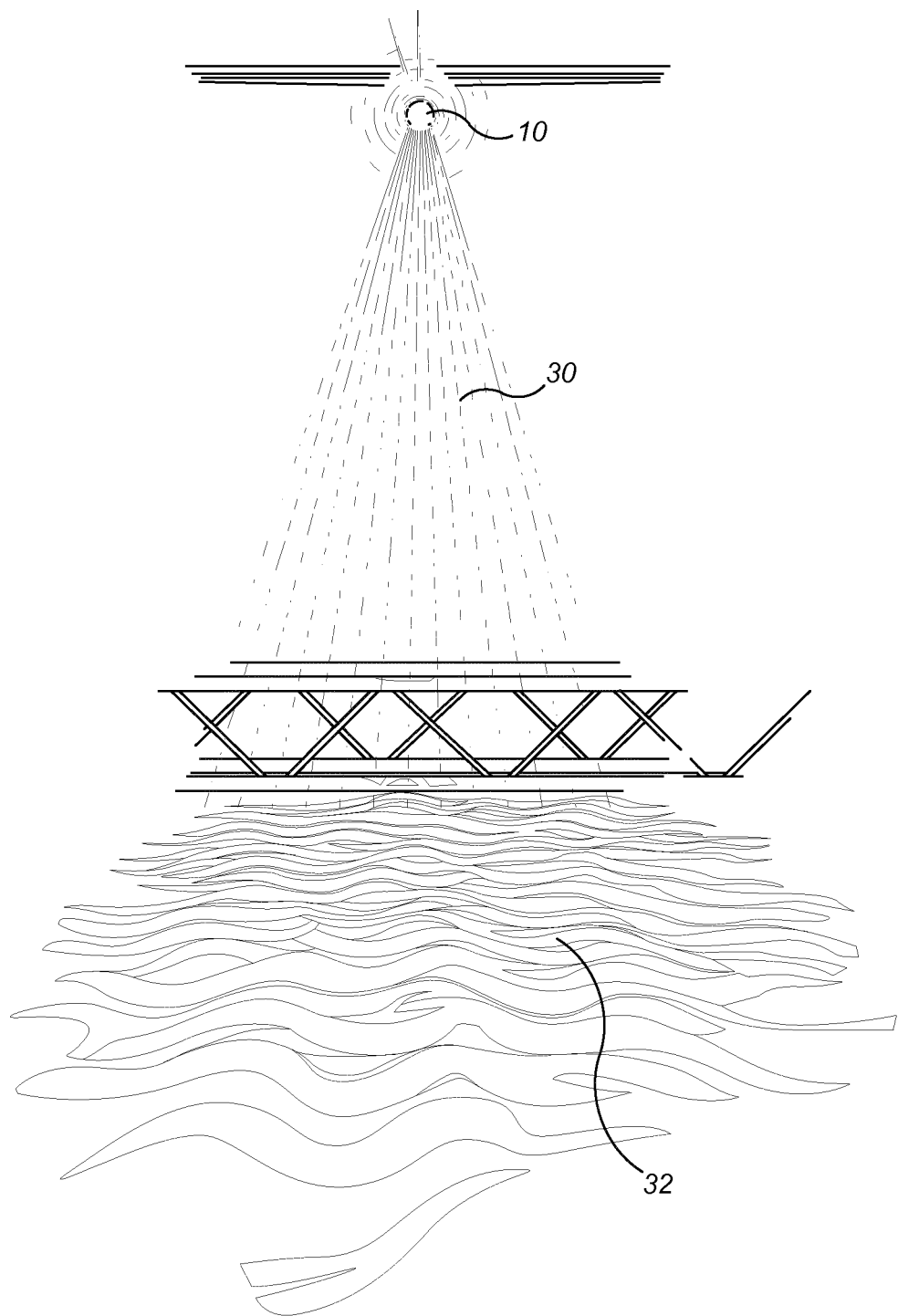
FIG. 3 is an illustration of a beam casting a custom lighting pattern.

As shown in FIG. 5, the system is arranged to assist the user in designing a lighting effect 32 to be formed by the light beam 30 emitted by an illumination source 10 (see also FIG. 3). Particularly, the tool 160 is configured to generate a design for the lighting effect 32 to illuminate a specific target object 44, e.g. an artwork, ornament, or a particular piece of furniture. The illumination source 10 may take the form of any lighting device for emitting illumination to illuminate the target object 44, e.g. the illumination source 10 taking the form of a luminaire or a lamp for fitting into a luminaire (a luminaire being a lighting device comprising a lamp plus any associated housing, socket and/or support). In embodiments, the illumination source 10 is a lighting device that is not yet installed or which does not yet even exist at the time of using the tool 160 to design the effect 32. In this case the lighting design tool 160 generates a custom design for the illumination source, or at least a component of it (e.g. a gobo or luminaire casing), so as to be configured to create the specified lighting effect 32. Alternatively the illumination source 10 may be a lighting device that is already installed or partially installed, but whose illumination output 30 is to be adapted to implement the specified lighting effect 32. E.g. this may be done by generating a custom design for a gobo to add to an existing illumination source 10. Or as another example, the illumination source 10 may be an existing illumination source 10 with an adaptable illumination beam 30, in which case the lighting design tool 160 may control the beam 30 to create the specified lighting effect 32.

In operation the user 46 holds the camera 140 up to the position of the illumination source 10, or the position at which the illumination source 10 is going to be installed, with the camera 140 pointed in the direction of the virtual line between the position of the illumination source 10 and the target object 44—i.e. so the camera 140 is placed at the position of the illumination source 10 facing toward the target object 44. In embodiments, the illumination from the illumination source 10 is emitted, or will be emitted, in the form of a beam 30 having that has at least a $2^{nd}$ order of rotational symmetry about an axis of the beam (e.g. a circular, elliptical, square, rectangular, hexagonal or start-shaped beam profile with the centre of the circle, ellipse, square, rectangle, hexagon or star on the beam axis). In this case the beam axis may be directed at a point on the target object 44, and the direction in which the camera 140 is directed may be along the beam axis (or the direction in which the beam axis will be directed when the illumination source 10 is installed). However, more generally the direction of the camera 14 could be any virtual line between the position of the illumination source 10 and any target point on the target object 44. The direction of the camera 140 may be defined as the direction perpendicular to the plane of the camera's image sensor, or the direction from which parallel rays of light incident upon the camera's lens will be focused to a point on the central axis of the camera's lens or on the centre of the camera's image sensor.

With the camera 140 placed and directed in this manner, the user 46 then triggers the camera 140 to capture one or more still images of the target object 44 from this position and angle, or even a video image. The camera 140 is thus used to capture an image or images of the target object 44 from the perspective or the "viewpoint" of the target object 44, i.e. a representation of how the illumination source 10 would "see" the target object 44 if its beam 30 was a field of view. The lighting design tool 160 is configured to apply image recognition algorithm to the captured image or images to detect one or more parameters of the target object 44, e.g. the shape of its profile (it silhouette) from the perspective of the position of the illumination source 10, and/or its distance from the illumination source 10, and/or one or more measurements of the size of the target object 44, and/or a relative orientation of the target object 44 relative to the target object, and/or one or more colours of the target object 44.

Furthermore, the lighting design tool 160 is configured to automatically generate a specification for the lighting effect 32 in accordance with the one or parameters of the target object 44 detected in this manner. For instance, the lighting design tool 160 may specify the size and shape of the profile of the beam 30 such that the pattern 32 it casts upon the target object 44 fits the shape and size of the target object 44 (e.g. if the target object 44 is a rectangular painting, the beam is adapted to have a rectangular profile of a size that matches the size of the painting at the distance at which it is incident upon the painting). And/or, the lighting design tool may select one or more colours of the effect 32 to complement one or more colours of the target object (e.g. if the target object 44 is red, then white or red light should be selected as blue light will not be reflected from the target object.) As another example, the lighting design tool 160 may specify where the location of a particular feature of the effect 32 should lie on the target object 44, e.g. such that a central spot illuminates the centre or a particular prominent feature of the target object 44.

In some embodiments, one or more parameters of the target object 44 may be captured automatically by the tool 160 from the image captured from the intended position of the lighting device 10, whilst the user 46 provides further information on one or more other of the parameters related to the target object through a manual user input through the user interface 42 (e.g. touchscreen of the smart device 40). In this case the tool 160 computes the generated specification for the lighting effect 32 and/or custom illumination source 10 or component based on both the automatically detected parameter(s) and the manually input parameters(s).

The controller 160 is coupled to the lighting implementation means 162, and thereby arranged to request the lighting implementation means 162 to take one or more steps to implement the custom lighting effect 32 generated by the lighting design tool 160 based on the image or images captured by the camera 140. For instance the tool 160 may generate a specification for a custom design of the illumination source 10 or a particular component of the illumination source 10, e.g. a gobo, a diffuser casing, or such like. In such cases the lighting implementation means 162 may take the form of a 3D printer for printing the design generated by the lighting design tool 160. As another example the lighting implementation means 162 may take the form of an online service to which the lighting design tool 160 is connected over the Internet, and from which the tool 160 can thereby place an order for its custom design to be created and mailed back to a user of the system.

In alternative embodiments the lighting design tool 160 does not generate a custom illumination source 10 or component per se, but rather controls the light output 30 of the illumination source 10 to render the specified lighting effect 32. In this case the illumination source 10 is of a type that has a controllable illumination output such that the shape, size, pattern and/or colour(s) of the beam 30 of the beam 30 is/are adaptable, thereby enabling adaptation of the effect 32 cast by the beam on the target object 44. Further, in this case, the lighting implementation means 162 comprises a lighting control subsystem arranged to control the illumination output 30 (wherein the control subsystem could be external to the illumination source 10 or integrated in the illumination source 10, or a combination of the two). For instance the illumination source 10 may comprise an array of individually addressable light-emitting elements, e.g. an array individually addressable LEDs or clusters of LEDs; and the lighting control subsystem 162 may be arranged to thereby individually control different ones of the light-emitting elements to render the custom lighting effect 32 specified by the tool 160.

Capturing the image from the perspective of the light source 10 (or to-be-installed light source 120) is advantageous because it improves the detection of factors such as the direction from which the target object is going to be illuminated, and/or the distance between the illumination source 10 and the target object 44, based upon which the properties of the lighting effect such as spot shape and/or size are calculated. Taking an image from any other point of view would require more images and a complex manual input from the user to indicate the desired location and direction of the light source 10 within a 3D model of the environment. On the other hand, taking an image from the "perspective" of the illumination source 10 (along the optical axis between the illumination source 10 and the target object 44) greatly simplifies the required calculations and the user's effort. Otherwise relative positions of target, camera and luminaire and their orientations need to be determined. Additionally if a camera picture is taken under a significantly different angle than the light source 10, the apparent shape of the (3D) object might be significantly different as seen from both angles. So in that case actual 3D info of the object would also be required.

In embodiments, the lighting design tool 160 requires some means of determining the distance between the camera 140 and the object 44 to be illuminated, before it can then automatically determine one or more other parameters of the target object 44 such as its size. In some embodiments this distance may be indicated manually by the user through a suitable user interface, such as the UI 42 of the smart device 40. In other embodiments however, the camera 140 may be equipped with distance sensing means for automatically determining the distance between the light source 10 and the target object 44. For instance the camera 140 may be equipped with one or more depth sensors (e.g. it could be a depth aware camera comprising a respective depth sensor at a position of each of some or all of its pixels). Or depth can also be measured using a stereo camera arrangement in the smart device 42 if so equipped. In such cases the tool 160 may be arranged to receive the distance measurement from the distance sensing means, which, with the camera 140 positioned at the position of the illumination source 10 and directed toward the target object 44, gives the tool 160 the distance between the illumination source 10 and the target object 44.

In another example, the user could place a tag next to the object 44 wherein the tag has one or more predetermined dimensions that are pre-known to the tool 160. The tool 160 may be configured to then calculate the size of other objects next to the tag such as the target object 44, by reference to the one or more predetermined dimensions of the tag.

As another example, it is possible to use sound to determine distance. This may be implemented controlling a speaker of the smart device 40 to emit a sound, and then measuring the time between emitting the sound and receiving it back at a microphone of the smart device 40 after a reflection from the target object 44. Other distance measurement devices could potentially also be incorporated into future smartphones.

Once the distance to the object 44 is known to the tool 160, it can then use geometric relationships to automatically compute the size of one or more dimensions of the target object 44. E.g. if the tool 160 knows the focal length of the camera 140 and the object distance the lighting design tool 160 can automatically calculate the real size of an item 44 in the image. In embodiments the focal length may be a value output by the camera 10, which the lighting design tool 160 is arranged to automatically retrieve. Alternatively the focal length may be input manually by a user through the user interface 42. Either way, the focal length will give the lens field of view in terms of degrees, from which the tool 160 can then calculate the angular size of the object. Once the distance and angular size are known, the tool 160 can automatically calculate actual size.

It is also possible to work the other way round: i.e. the user may manually input the size of one or more dimensions of the target object 44 through a suitable UI, e.g. the UI of the smart device 40, and the lighting design tool 160 may then automatically determine one or more other properties of the target object 44 based on this and the image, e.g. to determine the distance between the illumination source and the target object 44, and/or the size of one or more other dimensions of the target object.

Note that the distance between the illumination source 10 and the target object 44 is not required in all possible embodiments. As mentioned, based on the specifications of the camera lens (e.g. f-number . . . ) the field of view can be determined (e.g. the angular size the image subtends). Using image analysis the tool 160 can then recognize object 44 and determine its angular size. Thus it is possible to determine only the relative beam shape (beam intensity distribution) of the illumination source 10. No distances are needed, since this only concerns angular space.

Other parameters of the target object 44 that may alternatively or additionally be automatically extracted from the captured image(s) included colour, texture, reflective properties and/o object shape. Techniques for detecting colour, texture and object shape from an image are in themselves known in the art.

Object shape can for example be estimated using edge detection.

When all the relevant information is known to the tool 160, as well as the type of effect that user wants to achieve, it can then automatically calculate the required optics. Algorithms for generating a desired effect or an optical element such as a gobo to create the desired effect, once the effect is specified, are in themselves known in the art. For instance, the actual distance and spatial size of the object 44 may be used to determine the flux (i.e. the total amount of light) from the light source 10. If an object has a certain angular size, the amount of light needed to illuminate it is larger if this object if further away (meaning it is also bigger). The amount of light needed scales with the area to be illuminated, which scales with the square of the distance to this object (for an object with the same angular size). Once the desired intensity distribution (e.g. beam shape) is known, known optical design algorithms can be used by the tool 160 to automatically generate this distribution. Thus the lighting design tool 160 comprises, or is arranged to interface with, software that can analytically (or numerically via trial and error) calculate the 3D shape of an optical element such as a gobo or a refractive optical element which results in a given lighting intensity distribution (the actual calculation requires only a fraction of a second). An example of such commercially available software is FFTOP Freeform Tailored Optical Package), recently renamed/relaunched as FFOptic. Other commercial general optical design tools also have some of this functionality, e.g. LightTools or Zemax.

In embodiments, as will be discussed in more detail shortly, the lighting control tool 160 may also be configured to display on a user interface of the (or a) smart device 40: a preview 10' of the proposed lighting device 10, a preview 32' of the proposed lighting effect 32, and/or a preview 44' of the illuminated object 44 as illuminated by the proposed lighting effect 32. This way the user 46 can see in advance what the effect 32 generated by the tool 160 will look like before confirming to go ahead, e.g. before ordering or 3D printing the custom illumination source 10 or component.

Some particular example implementations of the disclosed concepts are now discussed in more detail with reference to FIGS. 4 to 15.

In embodiments the tool 160 takes the form of a dedicated smartphone app that is configured so as when run on the smart device 40 to guide the user 46 steps that he or she needs to go through in order to capture the image(s) and order or print the illumination source 10 (or component thereof). Once one or more pictures are taken the tool 160 may prompt the user 46 to give additional information like a desired shape and material for the illumination source 10 (e.g. custom luminaire). The tool 160 may also generate an impression (a 'preview') 32' of the proposed lighting effect 32 and also a preview 44' of how the target object 44 will look under the illumination 30, 32 from the new illumination source 10. Further, based on the preview 44', in embodiments the tool 160 may also provide the user 46 with the option to tweak (manually adjust) one or more properties of the lighting effect 32 or custom illumination source 10 or component if desired before it is implemented (e.g. before ordering or printing). This manual adjustment by the user 46 may be entered through any suitable user interface, e.g. a touchscreen 42 of the smart device 40.

In some embodiments the type and shape of the illumination source 10 may be limited to a simple spot light for which a custom gobo will be generated based on information on relative position and/or orientation of the spotlight 10 relative to the target object, and/or a shape of the target object 44. The customization in this case may for example include shape and size of the spot 32 and location of any decorative light effects. For instance see FIGS. 6 and 7.

Figure 7:
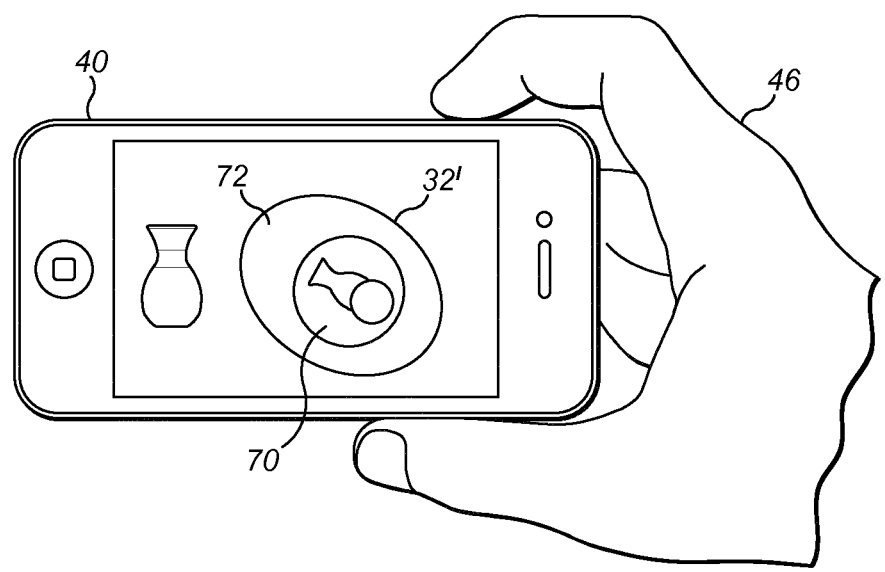
FIG. 7 is a schematic illustration of a smart device giving a preview of a lighting effect.

In the situation depicted in FIGS. 6-7, after the user 46 takes the picture, the lighting design tool 160 first automatically models a part of the gobo for creation of a central spot 70 targeted on the target object 44. Then the user 46 gives a manual user input through the user interface 42 (e.g. touch screen of the smart device 40) to add decorative elements in a periphery region 72 of the spot 32, such that they are not projected directly on the target object 44, but rather around the object 44.

Figure 8:
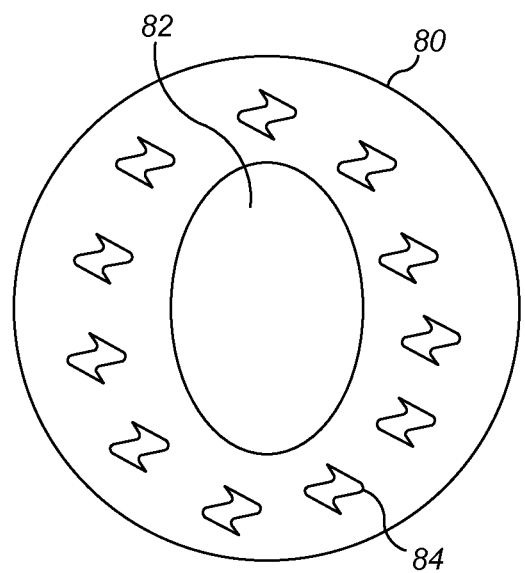
FIG. 8 is an illustration of an example gobo.

FIG. 8 illustrates an example of a resulting design of a gobo 80. In this example, corresponding to the previewed effect 32 in FIG. 7, the shape of a central part 82 of the gobo 80 creates the central part of the spot 70, whilst patterned holes 82 around a periphery region of the gobo cerate the decorate pattern 72 around the central spot 70. In other examples, the gobo 80 may for example be shaped to compensate for the spot light angle.

Figure 9:
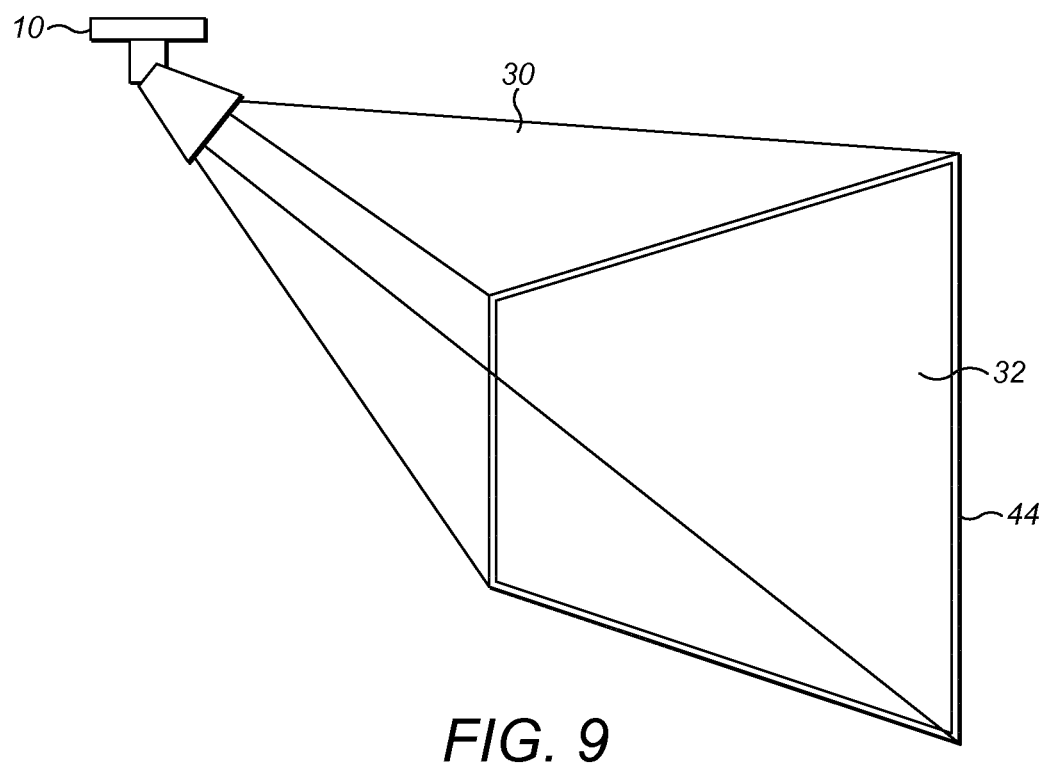
FIG. 9 is a schematic illustration of a light source illuminating a target object.

FIG. 9 shows another example whereby the light 30 of a spotlight 10 is blocked in such a way that a rectangular spot 32 results which is tailored towards the size and shape of a rectangular artwork 44 on the wall. The dimensions (shape, size, distance) are derived by the tool 160 based on the captured image(s), e.g. with the tool 160 running on the smart device 40 capturing the object 44. Or in a variant of this, one or more of the properties of the target object 44 are detected automatically by the tool 160 from the image captured from the intended position of the lighting device 10, while the user 46 provides further details on one or more other properties via a manual input, e.g. on key dimensions such as the relative position of the spotlight 10, distance to the wall, and/or size of the artwork 44.

As an alternative to producing a separate luminaire element such as a gobo 80 to block parts of the light 30 of the illumination source 10 in order to create the customized beam shape, it is also possible that a digitally manufactured luminaire 10 is produced in such a way that the light blocking element is produced as part of the complete luminaire body. For instance, the luminaire housing may comprise one or more light-blocking elements which are positioned at the sides of the light-emitting side of the luminaire such that it blocks part of the light in the periphery of the spotlight, thereby creating a custom light shape.

Either way, to determine the required shape of the gobo 80, housing or other such optical element, commercial ray-tracing software packages are available which allow the optimization of the shape of reflective or refractive surfaces in order to obtain a desired beam shape; e.g. Synopsis LightTools (optics.synopsys.com/lighttools); and Zemax (www.zemax.com). Based on such packages or other techniques, the shape of one or more parameterized optical surfaces can be optimized to best approximate a defined target beam shape. Each time surface shape parameters are varied, light rays are traced from the light source 10 through the optical element 10, and the resulting beam shape 32 is calculated and compared to the target distribution. For more complex surface shapes (e.g. so called freeform surfaces, not limited to easily parametrized surfaces like spherical or aspherical surfaces) software solutions and algorithms are known which allow calculation of the required shape using semi analytical solutions (as opposed to brute force ray tracing). A commercial example of such a software package is ffTOP (freeform Tailored Optical Package).

Thus to be able to generate the specified lighting effect, the lighting design tool 160 may be configured to incorporate one or more algorithms from such a package, or may be arranged to interface with one or more algorithms from such a package, in order to automate the generation of the specification for the gobo 80 or other such optical element or elements for the custom design. The user need not be exposed to the ray-tracing software directly, but rather only need act through the user-friendly use interface of the lighting design tool 160. I.e. instead a lighting distribution is determined from the camera image, and this is then used as input for the calculation of the optical design, instead of the user having to explicitly operate the ray tracing software. This latter part is essentially hidden to the user. In embodiments, at the most the user receives a simulation of the resulting luminaire.

Figure 10:
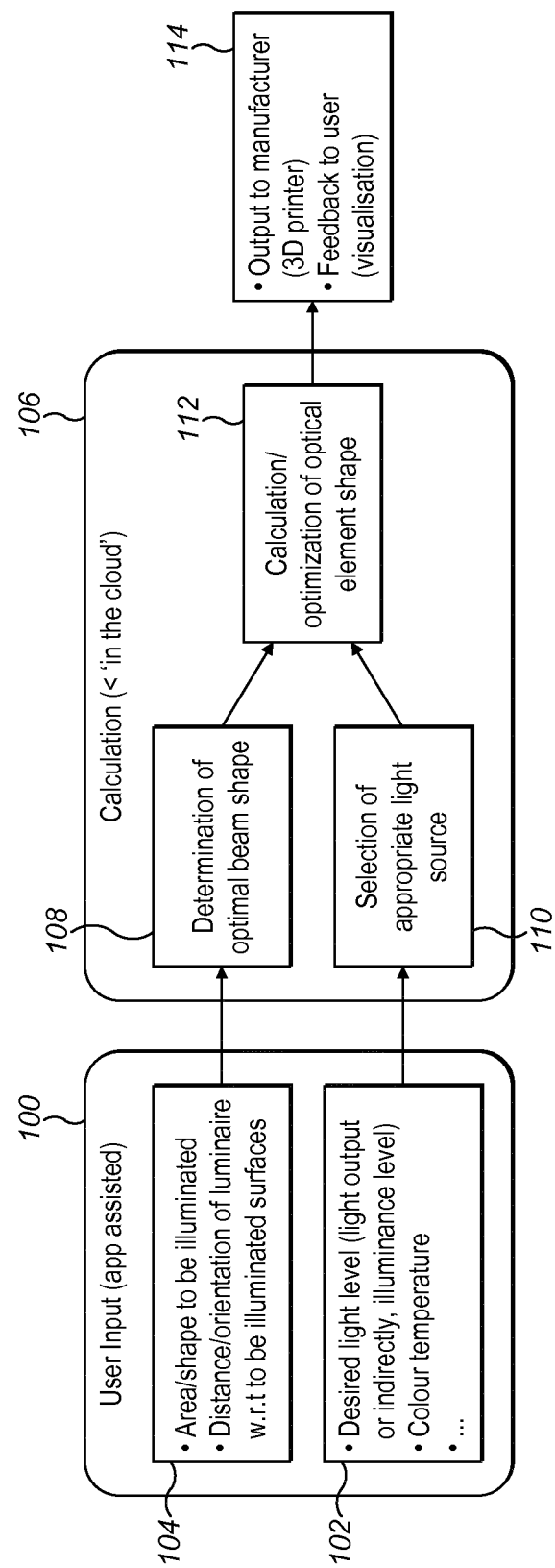
FIG. 10 is a process flow diagram illustrating a process of designing a custom light source.

FIG. 10 illustrates an example process flow. At step 100 the tool 160 receives input, which may comprise a combination of one or more parameters detected automatically from the image(s) captured by the camera 149 from the perspective of the to-be-installed illumination source 10, and optionally one or more parameters input manually by the user 46 through the user interface 42 (e.g. the touchscreen of the smart device 40), with the tool 160 guiding the user 46 through the process. The input may comprise for instance: (104) the area or shape to be illuminated, and/or a distance orientation of the illumination source 10 relative to the target object 44. The input may further comprise: (102) a desired light level, e.g. in terms of light output level or illuminance level upon the target object 44; and/or a desired colour of the light, e.g. in terms of colour temperature.

At step 106 the tool 160 computes a specification for a lighting effect 32 for illuminating the target object 44, and in embodiments a specification a target optical element such as a gobo 80 or luminaire housing for creating the effect 32. E.g. this computation may be performed by a par of the tool 160 implemented in the cloud, or may be implemented locally on the smart device 40. The computation may comprises: (108) determination of an optimal beam shape, (110) selection of an appropriate type of illumination source 10, and/or (112) calculation of the shape of an optimal optical element 80. At step 114 the tool 160 outputs the generated specification to the manufacturer or a 3D printer 162 to generate the custom lighting device 10, or in alternative embodiments outputs the specified lighting effect 32 to a controllable light source 10 having controllable beam-forming capability. Optionally the tool 160 also provides a preview 10', 32', 44' to the user 46 prior to doing this.

Figure 11:
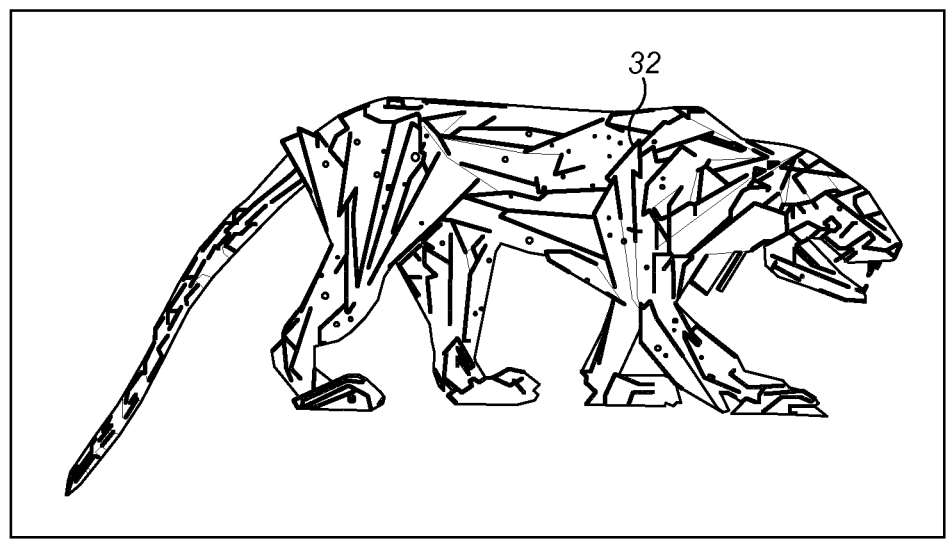
FIG. 11 is an illustration of an example of a custom lighting pattern.

In some embodiments the user 46 may use the tool 160 to design a sophisticated patterned filter 80 which is customized for the target object 44, such as to "paint" a picture in light on the target object 44. FIG. 11 shows an example of how a custom pattern in the gobo 80 can be used to project a special effect 32 on the target object 44.

Figure 12:
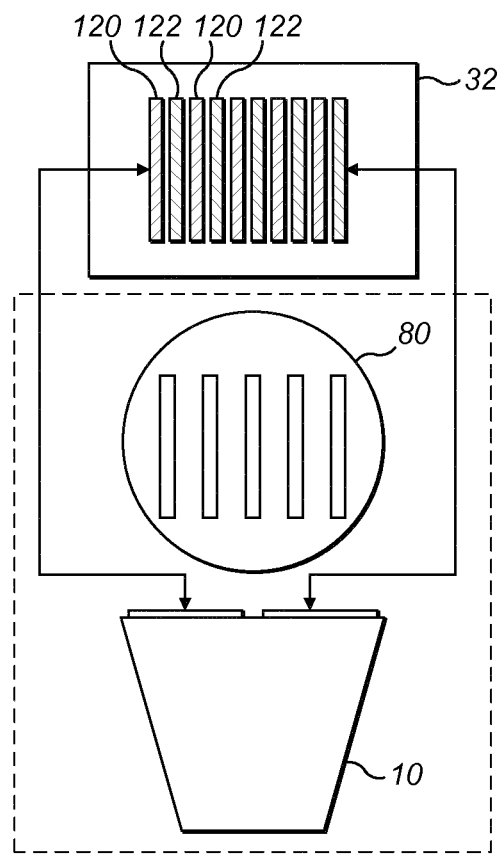
FIG. 12 illustrates an example of a shifted pattern created by a pixelated light source.
Figure 13:
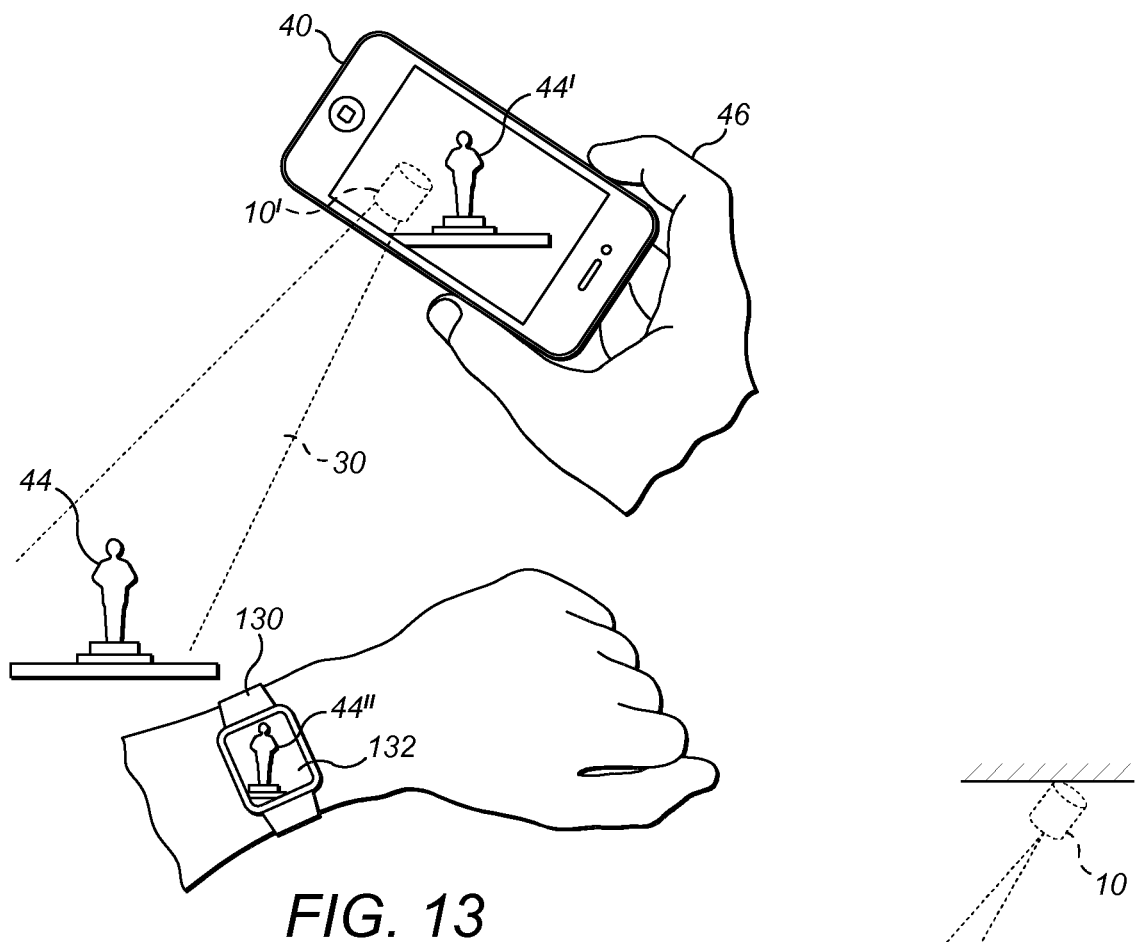
FIG. 13 illustrates a smart device operating in conjunction with a secondary smart device.

In another embodiment the illumination source 10 may be configured to provide a digitally movable light spot 32 that would allow creation a dynamic illumination effect, e.g. so that a dedicated pattern effect 32 such as that shown in FIG. 12 becomes "alive". For instance one way to achieve this is by using an illumination source 10 in the form of a pixelated spotlight. One example is shown in FIG. 12. Here, by dynamically varying the brightness of different subsets of pixels, the effect of movement can be achieved as the pattern slightly shifts. For instance, in the particular example shown in FIG. 12, light from a pixelated illumination source 10 (e.g. pixelated spotlight) is shone through a custom gobo 80. Further, the light 30 from the pixelated illumination source 10 is switched alternately between two (or more) different distributions: e.g. one where the light is emitted only from a leftmost subset of pixels of the illumination source's pixel array, and one where the light is emitted only from a rightmost subset of the pixel array. Under the two (or more) different distributions, the light passes through the gobo 80 from different angles, and hence the pattern 32 cast on the target object 44 shifts in space, in this case between a first instance 120 of the pattern at a more right-hand shifted position and a second instance 122 of the pattern at a more left-hand shifted position.

Further extensions to the disclosed techniques are also possible. For instance, in order to address situations where holding the smart device 40 (e.g. phone) up to the position of the illumination source 10 means that its screen 42 will not be visible to the user 46, then in embodiments a secondary device 130 such as smart watch, tablet or laptop can be used to assist the user 46. In this case, a video of the camera's current view may be streamed from the camera 140 on the primary smart device 40 (e.g. smart phone) to the secondary device 130 (e.g. smart watch), and played out through a display 132 on the secondary device 130 in order to help the user position the camera 140 on the primary device 40. Alternatively or additionally, the screen 132 of the secondary device may be used to show a preview 44" of how the effect 32 will look on the target object 44, and/or a preview of the proposed specification for the custom lighting device 10 or component thereof. For such purposes, the secondary device 130 may connect to the primary device 40 via any suitable wireless connection such as using Wi-Fi, ZigBee, Bluetooth or Thread. Or as a variant, the tool 160 could be hosted externally to both the primary and secondary devices 40, 130, e.g. on a server, and both the primary device 40 and secondary device 130 could connect to the tool 160 via any such communication means (and optionally via a further hop over another network such as the Internet).

As another optional extension, when capturing the picture of the target object 44, data from one or more other phone sensors can also be captured to improve the estimation of the properties of the illumination source 10. Alternatively or additionally, data from one or more such sensors may be used when illumination source 10 is delivered to the user 46, so that the user 46 can use the phone to find the position from which the picture was taken, i.e. the location where the lighting device 10 is supposed to be mounted. For instance, the tool 160 may be configured to receive one or more readings from the gyro sensor and/or accelerometer of the smart device 40, to use the received reading(s) to estimate the angle of the camera 140 relative to the light source fixing surface (e.g. ceiling), and in turn to use this to assist in determining the one or more parameters of the target object 44 and/or the one or more properties of the specified lighting effect 32 and/or custom luminaire 10 or element 80 thereof. For instance, the tool 160 may use the angle of the camera 140 relative to the ceiling (or other such surface) to select a suiting housing that would simplify mounting and directing of the source 10 toward the object. More generally, any sensor may be used to contribute to the more accurate determination of information such as distances, positions and/or orientations.

Figure 14:
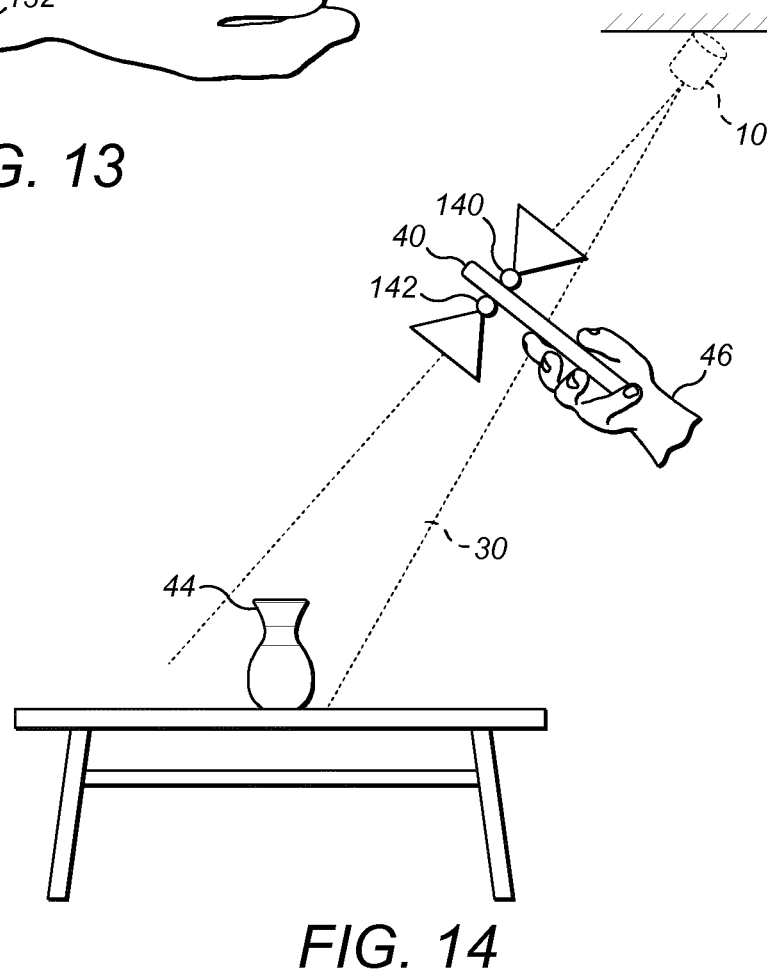
FIG. 14 illustrates a use of a front and rear facing camera of a smart device.

FIG. 14 depicts another possible extension, for use in cases where the intended location of the illumination source 10 is not easily reachable. In this case instead of locating the smart device 40 (e.g. phone) at the place where the illumination source 10 will be mounted, the smart device can be located at another position on the virtual line in between the location of the target object 44 and the intended location of the illumination source 10. Both the front-facing camera 140 and the rear-facing camera 142 of the smart device are used in this case. Further, in some such cases, the rear-facing camera 142 may be used to capture the image of the target object 44, depending on which orientation is most convenient or comfortable for the user 46 to view the main screen 42 of the smart device 40 whilst at the same time capturing the image of the target object. By way of illustration FIG. 14 shows the case where the rea-facing camera 142 is used to capture the image(s) of the target object 44, which is the opposite way round to the orientation mentioned in previous examples.

In such embodiments, whichever orientation of the smart device 40 is used, then after the pictures of the target object 44 are taken the user 46 may be prompted to indicate precisely where the illumination source 10 needs to be positioned in the view of the camera 140, 142 facing the illumination source 10. Moreover, as mentioned previously, the tool 160 is able to detect the distance position at which the illumination source is installed or to be installed (e.g. the distance to the ceiling or other surface where the light source will later be mounted) and to take this into account when computing the relevant parameters of the target object 44.

Figure 17:
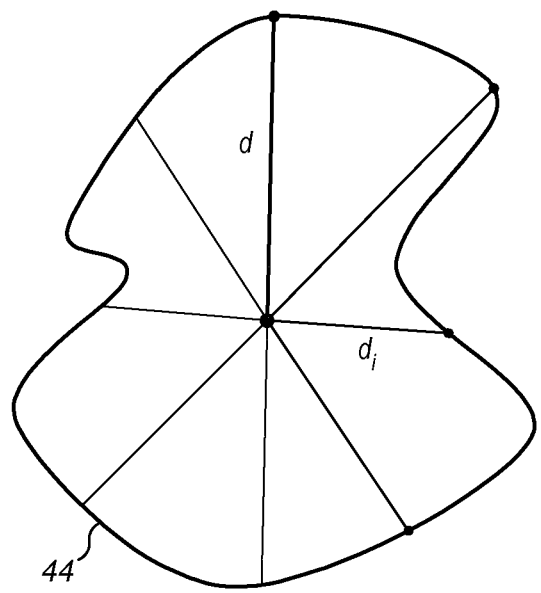
FIG. 17 illustrates an example shape of a target object as projected in 2D.
Figure 18:
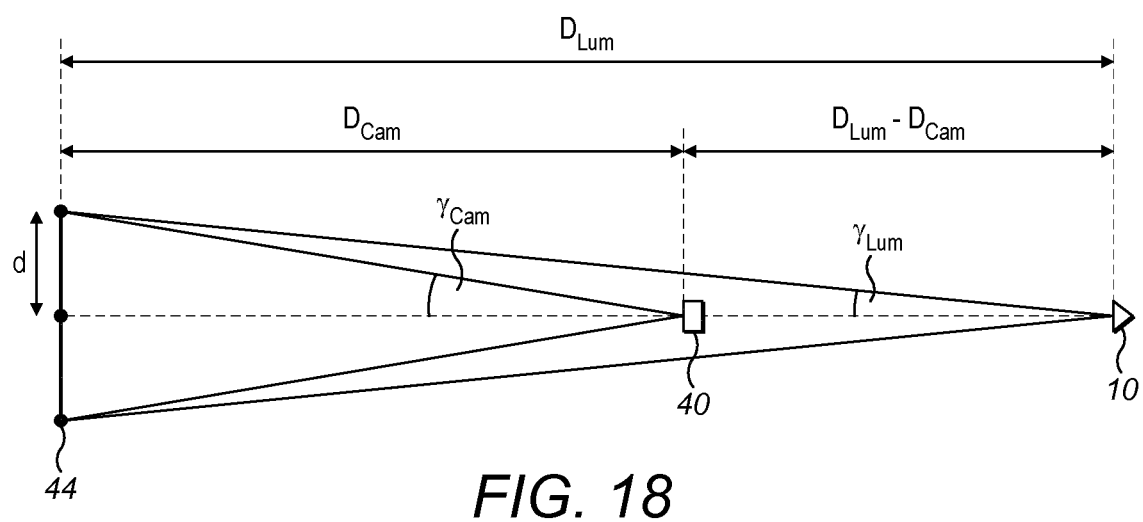
FIG. 18 shows example geometry for determining the angular size of a target object.

If the camera is not at the same position as the luminaire, distance information is needed to correctly calculate the angular size as would be seen by the luminaire. FIGS. 17 and 18 illustrate an example of how this can be done using a geometric calculation.

Figure 19:
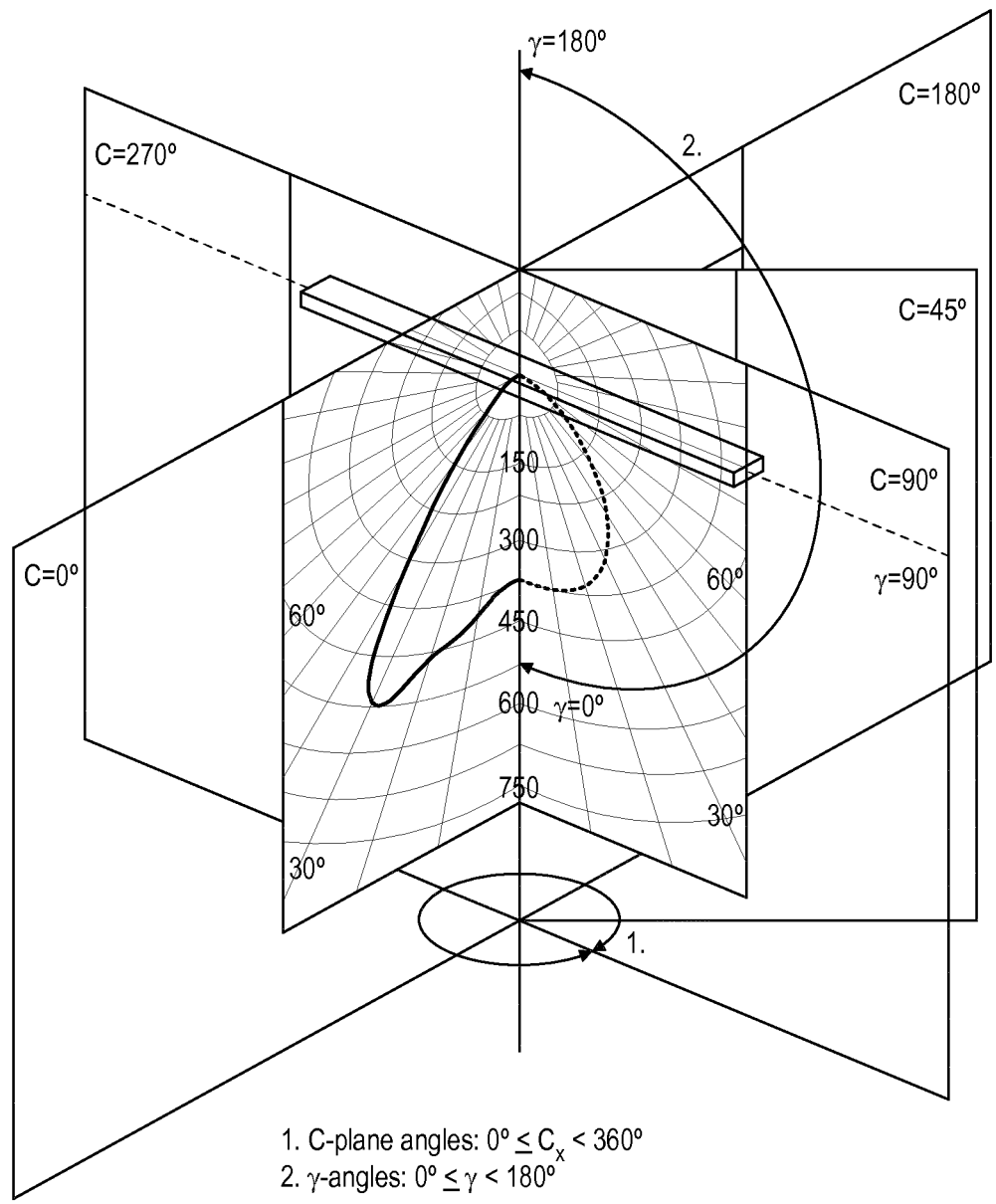
FIG. 19 is a plot of an example intensity distribution of a luminaire.

FIG. 17 shows an example of how a target object might look as seen from the perspective of the camera 140/142. The centre point shows the point where the optical axis of the light source 10 and camera 140/142 intercepts the target object 44. FIG. 19 illustrates an example intensity distribution of a light source 10 (e.g. luminaire), giving intensity values as function of angles γ [0°,180°] and ζ [0°,360°].

FIG. 18 further elaborates on how the angular size of an object 44 determines the beam intensity distribution of the luminaire. Based on the relative distances of camera 140/142 and the light source 10 to the target, and the apparent angular size of the target 44 in the camera image, the angular size of the target 44 as seen by the luminaire (corresponding to the required beam intensity distribution) can be calculated. Referring to the notation shown in FIG. 18, this can be calculated by:

$$\tan(\gamma_{Lum}) = \frac{D_{Cam}}{D_{Lum}} \cdot \tan(\gamma_{Cam})$$

This calculation can be repeated for multiple angular cross-section of the target object 44 (depending on the required angular resolution).

In more advanced cases where the object 44 is large as compared to the distance of the light source 10 (or camera 140/142), parts of the object 44 may be further away than others. In that case the basic correction above still applies (i.e. using the distance to the intersection point of the optical axis). Since parts of the target 44 that are further away will require relatively more light, than parts that are nearby, the tool 160 may be configured to apply additional corrections to the intensity, but this will require additional distance information (to different points of the object). E.g. such information could be detected using a depth aware camera.

Figure 15:
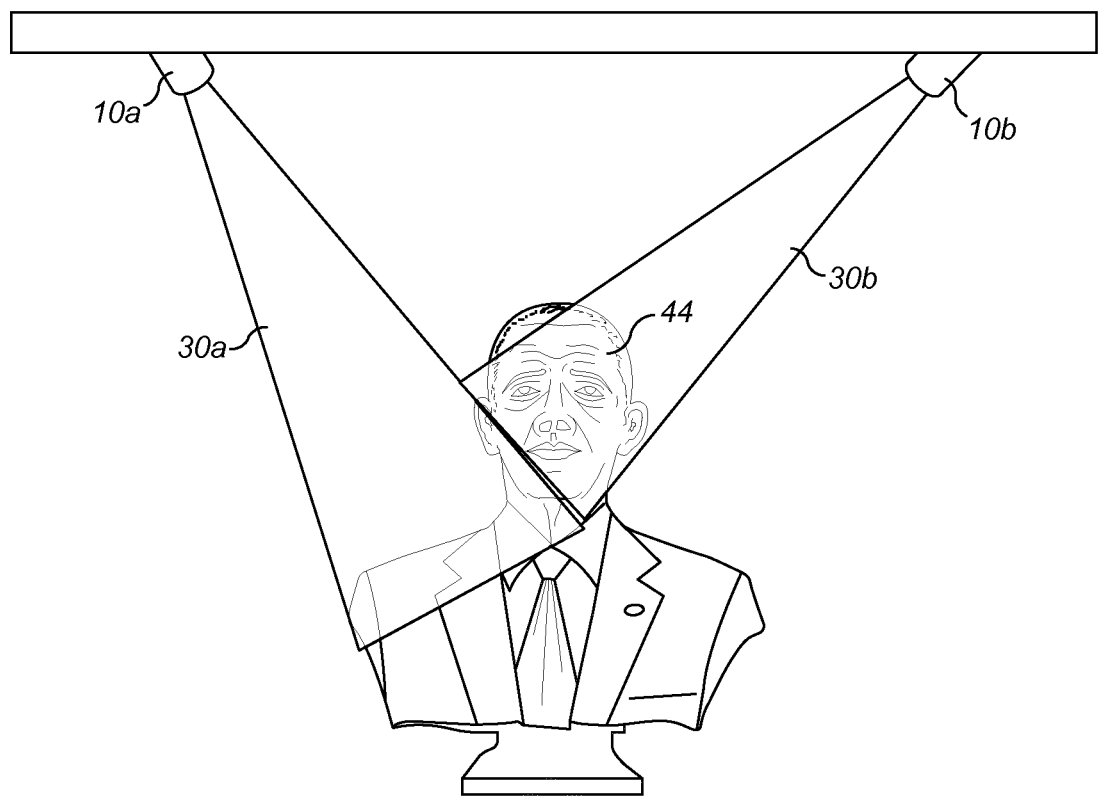
FIG. 15 illustrates a target object being illuminated by multiple spotlights.

In yet further optional extensions, it is also possible that the tool 160 is used to generate a specification for a customized illumination source 10 which comprises multiple directional spotlights, all created based on detected properties of the target object 44. FIG. 15 illustrates an example of an illumination source comprising multiple directional spotlights 10a, 10b customized for a specific target object 44, e.g. a statue or bust. For a good result, the required input can be either a 3D image of the object (e.g. captured using a depth aware camera), or multiple captured images of the various perspectives. For instance, one spotlight 10a can be targeted to illuminate a first prominent element of the target object 44 (e.g. the head of the statue or bust), whereas a second spotlight may illuminate a second element of the object 44 (e.g. the chest of the statue or bust). More and more advanced smart devices 40 nowadays are equipped with advanced object capturing possibilities to assess distances and depth maps, enabling calculation of 3D models of captured objects 44 which can provide useful input to generate the proposed customized lighting device 10.

The various techniques disclosed above have a number of possible applications, for example in a home environment, hotel or gallery to provide the best illumination for a specific object 44 (e.g. an art piece or ornament). Another example is in a retail environment, to provide a bespoke lighting effect for a certain product on display.

It will be appreciated that the above embodiments have been described by way of example only. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method of specifying a lighting effect to be emitted by an illumination source in order to illuminate a target object, the method comprising:
receiving at least one image captured by a camera of a camera device from a perspective of the camera being placed at a position at which the illumination source is to be installed, or elsewhere on a straight line between said position and the target object, and the camera being directed along said line toward the target object;
automatically determining one or more parameters of the target object based on the at least one captured image;
automatically specifying one or more properties for said lighting effect in dependence on the one or more parameters of the target object as determined based on the at least one captured image; and
instigating creation of said lighting effect so as to include the one or more specified properties;
wherein said specifying comprises generating a specification for the illumination source or at least one custom component of the illumination source, and wherein said instigating comprises outputting the specification to a system or service for generating the illumination source or the at least one custom component.

2. The method of claim 1, wherein the one or more specified properties of the lighting effect comprise one or more of:
a shape of the lighting effect,
a size of one or more dimensions of the lighting effect,
a pattern of the lighting effect,
one or more colours of the lighting effect, and/or
a location of a feature of the lighting effect.

3. The method of claim 1, wherein the one or more parameters of the target object determined from the at least one captured image comprise one or more of:
a shape of the target object,
a size of one or more dimensions of the target object,
a distance of the target object from said position,
an orientation of the target object, and/or
one or more colours of the target object.

4. The method of claim 1, wherein said outputting comprises sending the specification to a 3D printer with a request to print the illumination source or the at least one custom component.

5. The method of claim 1 wherein said outputting comprises placing an order for the illumination source or the at least one custom component over the Internet.

6. The method of claim 1, further comprising: displaying a preview to the user in a graphical user interface prior to said instigating, wherein the preview previews the automatically generated specification for the illumination source or the at least one custom component; and via the graphical user interface offering the user the option to:
confirm whether to proceed with said instigating, and/or
manually modify the specification prior to said instigating.

7. The method according to claim 1, further comprising: displaying a preview to the user in a graphical user interface prior to said instigating, wherein the preview previews the automatically determined lighting effect; and via the graphical user interface offering the user the option to:
confirm whether to proceed with said instigating, and/or
manually modify the lighting effect prior to said instigating.

8. The method according to claim 6, further comprising using a display of a secondary device, separate to the camera device, to display said preview to the user.

9. The method according to claim 1, further comprising using a display of a secondary device, separate to the camera device, to display a preview of the one or more images to the user prior to capture.

10. The method of claim 1, wherein:
the camera device comprises a front-facing camera and a rear-facing camera;
said camera is one of the front- and rear-facing cameras and is placed on said line but away from said position,
the method further comprises using the other of the front- and rear-facing cameras to detect a distance between the camera device and said position, and
the determination of the one or more parameters of the target object is further based on the detected distance between the camera device and said position.

11. The method of claim 1, wherein the illumination source comprises, or will comprise, multiple constituent lighting devices; and wherein said steps of placing, directing, determining and specifying are performed for each of the constituent lighting devices.

12. Computing equipment for specifying a lighting effect to be emitted by an illumination source in order to illuminate a target object, the computing equipment comprising:
a camera or an input interface for receiving an input from the camera;
an output interface for instigating creation of a lighting effect; and
an image processing module configured to process at least one image captured by the camera from a perspective of the camera being placed at a position at which the illumination source is to be installed, or elsewhere on a straight line between said position and the target object, and the camera being directed along said line toward the target object;
wherein the image processing module is configured to automatically determine one or more parameters of the target object based on the at least one image captured from said perspective, to automatically specify one or more properties for said lighting effect in dependence on the one or more parameters of the target object as determined based on said at least one captured image, and via said output interface to instigate the creation of said lighting effect so as to include the one or more specified properties;
wherein said specifying comprises generating a specification for the illumination source or at least one custom component of the illumination source, and wherein said instigating comprises outputting the specification to a system or service for generating the illumination source or the at least one custom component.

13. A computer program product for specifying a lighting effect to be emitted by an illumination source, in order to illuminate a target object, the computer program product comprising code embodied on computer-readable storage and configured so as when run on one or more processing units to perform operations of:
receiving at least one image captured by a camera from a perspective of the camera being placed at a position at which the illumination source is to be installed, or elsewhere on a straight line between said position and the target object, and the camera being directed along said line toward the target object;
automatically determining one or more parameters of the target object based on the at least one image captured from said perspective;
automatically specifying one or more properties for said lighting effect in dependence on the one or more parameters of the target object as determined based on said at least one captured image; and
instigating creation of said lighting effect so as to include the one or more specified properties;
wherein said specifying comprises generating a specification for the illumination source or at least one custom component of the illumination source, and wherein said instigating comprises outputting the specification to a system or service for generating the illumination source or the at least one custom component.

* * * * *